United States Patent
von Campenhausen et al.

(10) Patent No.: US 7,196,537 B2
(45) Date of Patent: Mar. 27, 2007

(54) INTEGRATED CIRCUIT

(75) Inventors: Aurel von Campenhausen, Cluvenhagen (DE); Joerg Vollrath, Olching (DE); Ralf Schneider, München (DE); Marcin Gnat, Mering (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/092,963

(22) Filed: Mar. 30, 2005

(65) Prior Publication Data

US 2005/0218960 A1 Oct. 6, 2005

(30) Foreign Application Priority Data

Mar. 31, 2004 (DE) .................. 10 2004 015 831

(51) Int. Cl.
*G01R 31/26* (2006.01)
(52) U.S. Cl. .................................. 324/765
(58) Field of Classification Search .......... 324/765, 324/158.1, 763, 760; 327/563, 334; 365/205, 365/207, 208, 230.03; 714/719, 724
See application file for complete search history.

(56) References Cited

U.S. PATENT DOCUMENTS 3,728,719 A * 4/1973 Fish .................. 341/117
4,683,386 A * 7/1987 Kamikawara .............. 327/308
5,365,768 A * 11/1994 Suzuki et al. ................ 73/1.01
5,631,601 A * 5/1997 Horsfall et al. ............. 329/325
6,489,799 B1 12/2002 Murakami
6,535,015 B1 3/2003 Krishnan et al.

OTHER PUBLICATIONS

NPN/PNP-Kennlinienschreiber, Elektor; Ausgabe Apr. 1998; pp. 56-60.

* cited by examiner

*Primary Examiner*—Ha Tran Nguyen
*Assistant Examiner*—Tung X. Nguyen
(74) *Attorney, Agent, or Firm*—Edell, Shapiro & Finnan, LLC

(57) ABSTRACT

An integrated circuit includes a circuit component, a first control circuit and a switchable resistance network. An input voltage is fed to the circuit component on the input side. A control signal generated by the first control circuit is fed to the control terminal of the circuit component. With the switchable resistance network, the first resistance or the second resistance is connected between an output terminal of the circuit component and the output terminal of the integrated circuit to generate a voltage drop between the input side and the output terminal of the circuit component. The integrated circuit makes it possible to generate a current at the output terminal of the circuit component in a manner dependent on the control signal and the voltage dropped between the input side and the output terminal of the circuit component. Families of characteristic curves of transistors of an integrated circuit are determined by the integrated circuit.

15 Claims, 2 Drawing Sheets

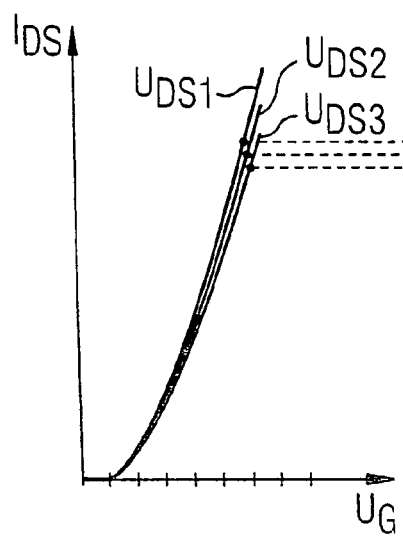
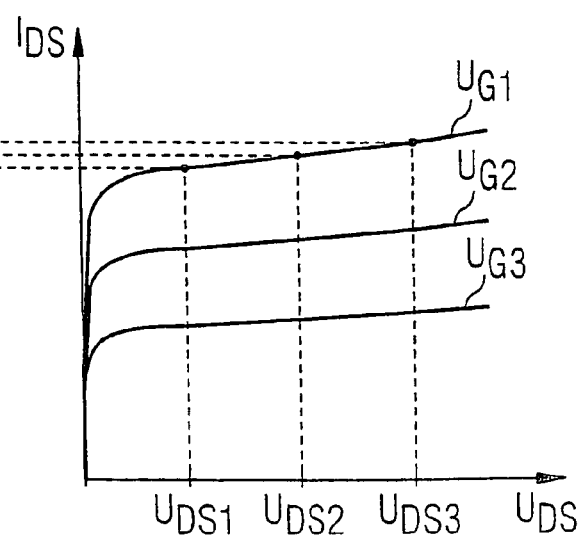
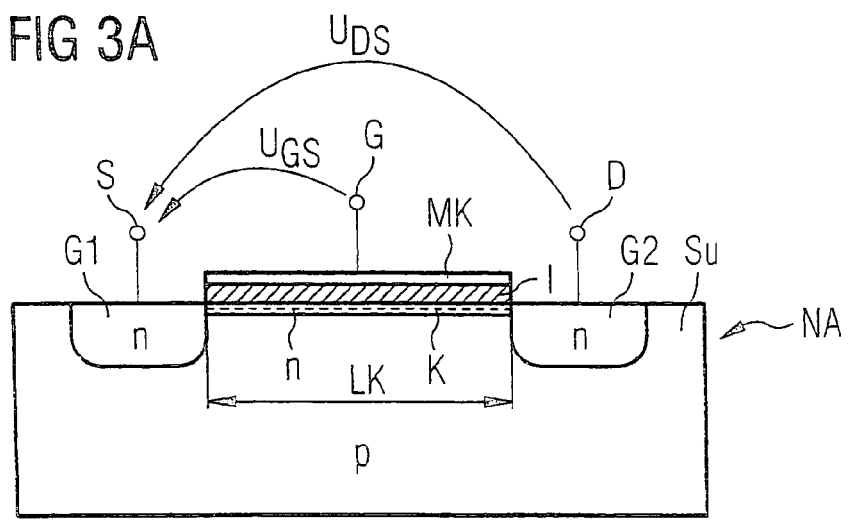
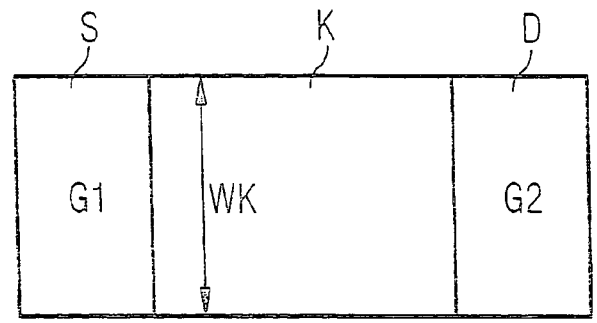

INTEGRATED CIRCUIT

CROSS REFERENCE TO RELATED APPLICATIONS

This application claims priority under 35 USC § 119 to German Application No. DE 102004015831.2, filed on Mar. 31, 2004, and titled "Integrated Circuit," the entire contents of which are hereby incorporated by reference.

FIELD OF THE INVENTION

The invention relates to an integrated circuit which can be used to determine characteristic curves of circuit components of an integrated circuit.

BACKGROUND

Integrated circuits in many instances comprise a large number of transistors. The memory cell array of an integrated semiconductor memory, for example, of a DRAM (=Dynamic Random Access Memory) semiconductor memory, comprises a multiplicity of memory cells constructed from in each case a selection transistor and a storage capacitor. The memory cells are arranged in matrix form between word and bit lines. A control terminal of a respective selection transistor of a DRAM memory cell is connected to one of the word lines. For a read or write access to the DRAM memory cell, the selection transistor is turned on by being driven with a corresponding control signal on the word line, so that the storage capacitor is connected to the connected bit line via the turned-on path of the selection transistor. In the event of a read access, the charge stored on the electrodes of the storage capacitor results in a change in potential on the connected bit line via the turned on path of the selection transistor. In the event of a write access, an item of information is stored in the memory cell via the turned on path of the selection transistor by the electrodes of the storage capacitor being charged to a high or low voltage level. The behavior of the selection transistors is therefore of crucial importance both for read operations and for write operations of the integrated semiconductor memory.

The behavior of the transistors can be determined most simply based on a family of characteristic curves, for example, an $I_{DS}/U_{DS}$ family of characteristic curves or an $I_{DS}/U_G$ family of characteristic curves. Such families of characteristic curves of transistors within an integrated circuit can only be determined at the wafer level at the present time. In the case of an integrated semiconductor memory, for example, special test structures of transistors are arranged within the sawing frame, the so-called scribe line. The gate, source, and drain terminals of the transistors can be contact-connected to probes of a test system via specially provided terminal pads. By driving the gate, source and drain terminals with control voltages generated by the test system, it is possible to determine families of characteristic curves of the test transistors. When the individual semiconductor chips are sawn out of the wafer, the test structures are lost, however. Therefore, there is no longer a possibility of recording families of characteristic curves of transistors of an integrated circuit which are already situated in a finished housed device.

It is found in an integrated circuit that many circuit components, in particular, transistors, fail even after a short operating duration. It is of particular interest, therefore, to record and compare families of characteristic curves of transistors at the beginning of their life cycle and after a certain operating duration in order to be able to make a reliable statement about the failure probability of the transistors. However, since a shortest possible test phase of integrated circuits is of interest, the circuit components are artificially aged in the context of a burn-in test. For this purpose, the circuit components of the integrated circuit are exposed to a higher operating voltage and an increased temperature for the duration of the burn-in test. Depending on the magnitude of the voltage with which the devices are operated and the temperature to which the circuit components are exposed, operating times longer than the actual length of the test can thus be artificially generated. In order to be able to make a statement about the failure probability of a transistor, it is desirable to record and compare the family of characteristic curves of a transistor before and after the conclusion of a burn-in test. However, since the burn-in test is carried out on the finished housed device, at the present time, it is not yet possible to determine families of characteristic curves of transistors in the context of a burn-in test.

An integrated circuit which can be used to determine families of characteristic curves of circuit components of an integrated circuit, in particular, of transistors, at the component level and a method which makes it possible to determine families of characteristic curves of circuit components of an integrated circuit, in particular, current/voltage characteristic curves of transistors are desirable.

SUMMARY

An integrated circuit according to the present invention includes an integrated circuit having an output terminal, a circuit component with an input terminal, a control terminal, and an output terminal, a first control circuit for generating a control signal, a switchable resistance network with an input side and an output side with a first and a second resistance. An input voltage is fed to the circuit component on the input side. The circuit component is connected to the output terminal of the integrated circuit via the switchable resistance network on the output side. The control signal is fed to the control terminal of the circuit component. Finally, the switchable resistance network is designed such that optionally either the first resistance or the second resistance is connected between the input side and the output side of the switchable resistance network. The circuit component is designed such that a current is generated at the output terminal of the circuit component in a manner dependent on the control signal and the resistance connected between the input side and the output side of the switchable resistance network.

Consequently, the integrated circuit makes it possible to record characteristic curves of any circuit components in which an output current varies depending on a voltage connected between the input and output terminals. In addition, the profile of the output current, in accordance with an applied control voltage, has a different curve profile depending on the voltage connected between the input and output terminals. Different current/voltage characteristic curves of the circuit component are thereby recorded for a respective control voltage.

According to one implementation of the integrated circuit according to the invention, the first control circuit has switching terminals for driving with first switching signals. In this case, the first control circuit is designed such that different control signals are generated in a manner dependent on the driving with the first switching signals.

According to a further feature of the integrated circuit, the first control circuit includes an input terminal for applying a first voltage potential and an output terminal for applying a second voltage potential. The first control circuit includes a first voltage divider and a second voltage divider. Furthermore, the first control circuit is designed such that, in a manner dependent on the driving of the switching terminals with the first switching signals, optionally either the first voltage divider or the second voltage divider is connected between the input terminal and the output terminal of the first control circuit.

In a further implementation of the integrated circuit, the first and second voltage dividers of the first control circuit each include a common first resistance and a respective different second resistance. In this case, the common first resistance of the first control circuit is connected between the input terminal and a control output of the first control circuit. The respective different second resistances of the first and second voltage dividers of the first control circuit are connected between the control output and the output terminal of the first control circuit. The control terminal of the circuit component is connected to the control output of the first control circuit.

According to a further implementation of the integrated circuit, the first control circuit includes a first controllable switch with a control terminal and second controllable switches with respective control terminals. The first controllable switch of the first control circuit is connected between the first common resistance and the control terminal of the first control circuit. Furthermore, a respective one of the second controllable switches of the first control circuit is connected between one of the second resistances and the control terminal of the first control circuit. An activation signal is fed to the control terminal of the first controllable switch. A respective one of the first switching signals can be fed to a respective one of the control terminals of the controllable switches of the first control circuit.

In another embodiment of the integrated circuit, the input terminal of the first control circuit is a terminal for applying a supply potential. In this embodiment, the first control circuit is connected, on the input side, to an input terminal of the integrated circuit for applying the supply potential.

The output terminal of the first control circuit may be a terminal for applying a reference potential. In this embodiment, the first control circuit is connected, on the output side, to an output terminal of the integrated circuit for applying the reference potential.

In a further implementation of the integrated circuit, the first controllable switch of the first control circuit is a switching transistor. The second controllable switches of the first control circuit are each a switching transistor.

In one development of the integrated circuit, the switchable resistance network includes switching terminals for driving with second switching signals. In this embodiment, the switchable resistance network is designed such that, in a manner dependent on the driving of the switchable resistance network by the second switching signals, optionally either the first resistance or the second resistance of the switchable resistance network is connected between the input side and the output side of the switchable resistance network.

In accordance with another feature of the integrated circuit, the switchable resistance network includes controllable switches with a respective control terminal. A respective one of the controllable switches of the switchable resistance network is connected between the input terminal of the switchable resistance network and a respective one of the first and second resistances of the switchable resistance network. Furthermore, a respective one of the switching signals is fed to a respective one of the control terminals of the controllable switches of the switchable resistance network.

In this case, the controllable switches of the switchable resistance network may each be a switching transistor.

According to another embodiment, the integrated circuit according to the invention includes control terminals for applying control signals and a second control circuit for generating the activation signal, the first switching signals, and the second switching signals. The second control circuit is connected to the control terminals of the integrated circuit on the input side. In this embodiment, the second control circuit is generates in a manner dependent on the control signals, on the output side in each case one of the first switching signals and subsequently successively the second switching signals.

According to a further embodiment of the integrated circuit, the input terminal of the circuit component is connected to the input terminal of the integrated circuit for applying the supply potential.

The circuit component is, for example, a field effect transistor in which a drain-source current is generated at a source terminal of the field effect transistor in a manner dependent on a gate voltage.

In one embodiment, the integrated circuit is an integrated semiconductor memory. The integrated semiconductor memory includes a memory cell array with memory cells. The memory cells each case include a selection transistor for selecting one of the respective memory cells. In this case, the selection transistor is, for example, a transistor with a specific conductivity type, a specific doping profile and a specific channel width to channel length ratio. The circuit component is, for example, a transistor with the same specific conductivity type, the same specific doping profile, and the same specific channel width to channel length ratio. For this purpose, the circuit component is, for example, produced in the same fabrication step as the selection transistors of the memory cell array. In this embodiment of the integrated circuit, families of characteristic curves of transistors, which correspond to the largest extent to the families of characteristic curves of the selection transistors are recorded.

A method for determining a current/voltage characteristic curve of a circuit component of an integrated circuit is described below. A control signal is generated at a control terminal of a circuit component by driving a first control circuit with a switching signal. A first resistance of a switchable resistance network is subsequently connected to an output terminal of the circuit component. A current intensity of a first current is determined at an output terminal of the integrated circuit, which is connected to the first resistance of the switchable resistance network. Then, a first voltage between an input terminal and the output terminal of the circuit component is determined. A second resistance of the switchable resistance network is subsequently connected to the output terminal of the circuit component. Next, a current intensity of a second current at the output terminal of the integrated circuit which is connected to the second resistance of the switchable resistance network, is determined. A second voltage between the input terminal and the output terminal of the circuit component is determined.

According to one implementation of the method for determining a current/voltage characteristic curve of a circuit component of an integrated circuit, a first controllable switch and a second controllable switch of the first control circuit are turned on, so that a first resistance is conductively connected to a second resistance of the first control circuit. Afterward, the control terminal of the circuit component is driven with the control voltage dropped across the second resistance of the first control circuit. A first controllable switch of the switchable resistance network is subsequently turned on, so that the first resistance of the switchable resistance network is connected to the output terminal of the circuit component and the first current is fed to the output terminal of the integrated circuit. Afterward, a second controllable switch of the switchable resistance network is turned on, so that the second resistance of the switchable resistance network is connected to the output terminal of the circuit component and the second current is fed to the output terminal of the integrated circuit.

After the first controllable switch and the second controllable switch of the first control circuit have been turned on, a current flows from an input terminal of the first control circuit to an output terminal of the first control circuit. The current flow arises because the input terminal of the first control circuit is connected via an interconnect to an input terminal of the integrated circuit for applying a supply potential. This current of the control circuit can be determined at the output terminal of the integrated circuit which is connected to the output terminal of the first control circuit. The voltage drop across the second resistance of the first control circuit, which voltage represents the control voltage of the circuit component, can be determined by forming a product of the second resistance of the first control circuit and the current of the first control circuit. Afterward, it is possible to determine the first voltage between the input terminal and the output terminal of the circuit component by forming a difference between the supply voltage present at the input terminal of the circuit component and a product of the current intensity of the first current at the output terminal of the integrated circuit and the first resistance of the switchable resistance network. The second voltage between the input terminal and the output terminal of the circuit component can be determined by forming a difference between the supply voltage present at the input terminal of the circuit component and a product of the current intensity of the second current at the output terminal of the integrated circuit and the second resistance of the switchable resistance network.

BRIEF DESCRIPTION OF THE DRAWINGS

The invention is explained in more detail below with reference to the figures illustrating exemplary embodiments of the invention. In the figures, FIG. 2A shows an example of an $I_{DS}/U_G$ family of characteristic curves of a transistor which can be determined with the integrated circuit according to the invention, FIG. 2B shows an example of an $I_{DS}/U_{DS}$ family of characteristic curves of a transistor which can be determined with the integrated circuit according to the invention, FIG. 3A shows a cross section through a transistor structure, and FIG. 3B shows a plan view of a transistor structure.

DETAILED DESCRIPTION

Figure 1:
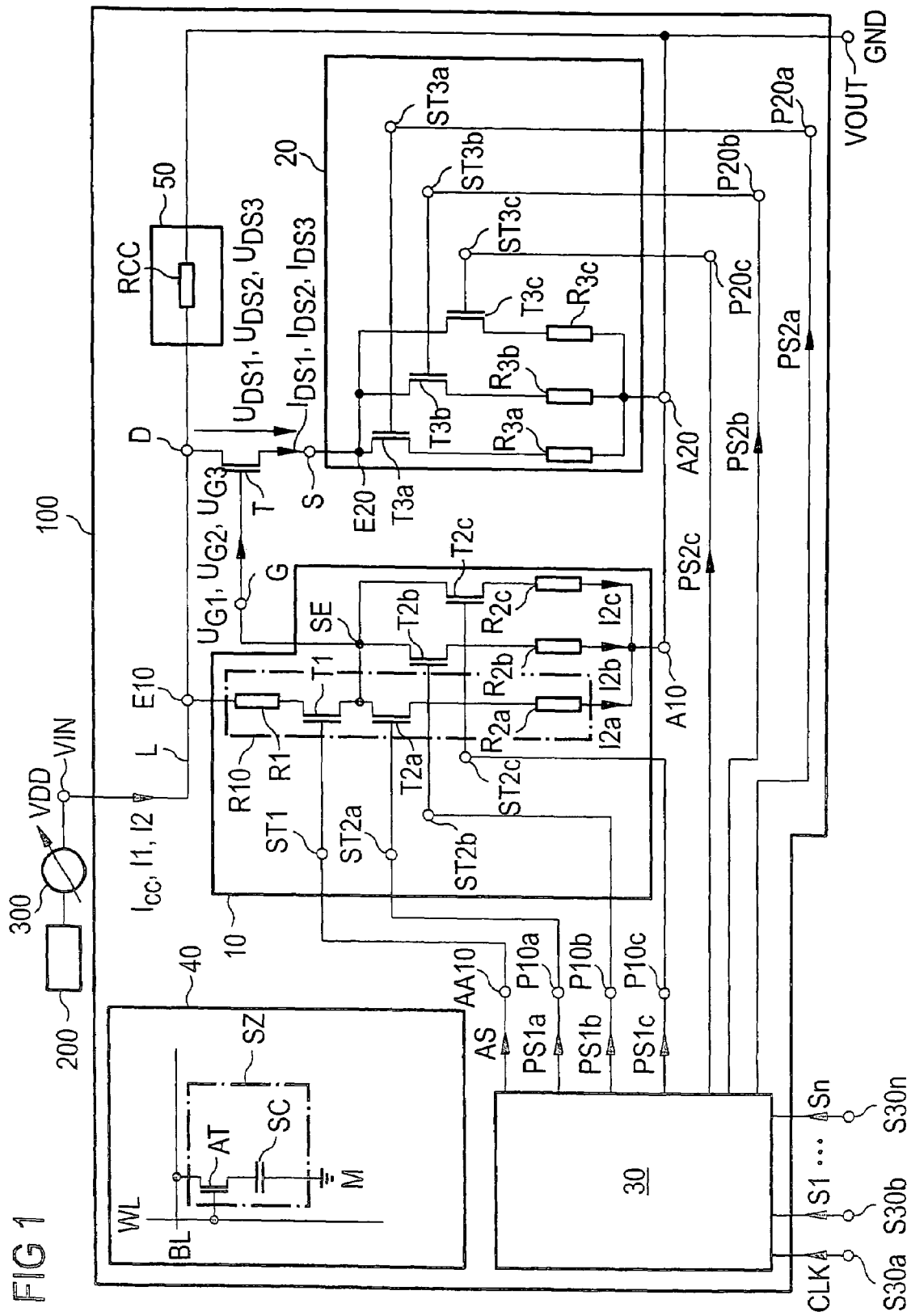
FIG. 1 shows an integrated semiconductor memory with an embodiment of an integrated circuit for determining families of characteristic curves of transistors in accordance with the invention.

FIG. 1 shows an integrated semiconductor memory 100 with an integrated circuit for determining families of characteristic curves of a transistor T. The integrated circuit includes a first control circuit 10 and a switchable resistance network 20. The integrated semiconductor memory also includes a second control circuit 30, a memory cell array 40 and additional circuit components that are illustrated by a circuit component 50 for simplicity in FIG. 1.

The memory cells of the memory cell array 40 are DRAM memory cells that include a storage capacitor SC and a selection transistor AT. For simplicity, only one memory cell includes a storage capacitor SC and a selection transistor AT is illustrated in the memory cell array 40. A control terminal of the selection transistor AT is connected to a word line WL. The storage capacitor SC, which is connected to a terminal M for application of a reference potential, is connected to a bit line BL via the controllable path of the selection transistor.

Since the selection transistor AT is important for both read and write operations to and from the DRAM memory cell, recording a family of characteristic curves of this transistor is of particular interest. Therefore, in the context of the process for producing the selection transistors of the memory cell array, a structurally identical transistor T has been implemented in the integrated circuit outside the memory cell array. An input terminal D of the transistor is connected via an interconnect L to an input terminal VIN of the integrated semiconductor memory for applying an external supply voltage VDD. An output terminal S of the transistor T is connected to an input terminal E20 of the switchable resistance network 20. The interconnect L furthermore connects the input terminal VIN of the integrated semiconductor memory via the further circuit components 50, which are illustrated as a nonreactive resistance RCC for the sake of simplicity, to an output terminal VOUT of the integrated semiconductor memory for applying a ground reference potential GND.

The first control circuit 10 of the integrated circuit according to the invention serves for setting three different gate voltages $U_{G1}$, $U_{G2}$ and $U_{G3}$ of the transistor T. The first control circuit 10 is connected to the interconnect L via an input terminal E10 of the first control circuit. A gate terminal G of the transistor T is connected to the input terminal E10 via the controllable path of a first switching transistor T1 and a first resistance $R_1$. The gate terminal G of the transistor T may be connected to the output terminal VOUT of the integrated semiconductor memory optionally via the controllable path of a second switching transistor T2a and a second resistance $R_{2a}$ connected downstream, or via the controllable path of a further second switching transistor T2b and a further second resistance $R_{2b}$ connected downstream, or via the controllable path of a further second switching transistor T2c and a further second resistance $R_{2c}$ connected downstream. Respective control terminals ST1, ST2a, ST2b and ST2c of the switching transistors T1, T2a, T2b and T2c are connected to the second control circuit 30.

The switchable resistance network 20 of the integrated circuit according to the invention serves for setting three different drain-source voltages $U_{DS1}$, $U_{DS2}$ and $U_{DS3}$ of the transistor T. A source terminal S of the transistor T may be connected to the output terminal VOUT of the integrated semiconductor memory optionally via a switching transistor T3a and a first series resistance $R_{3a}$ connected downstream, or via a switching transistor T3b and a second series resistance $R_{3b}$ connected downstream, or else via a switching transistor T3c and a third series resistance $R_{3c}$ connected downstream. Respective control terminals ST3a, ST3b and ST3c of the switching transistors T3a, T3b and T3c are each connected to the second control circuit 30.

The second control circuit 30 can be driven by a control clock CLK at a control terminal S30a and by further control signals S1, ..., Sn at control terminals S30b, ..., S30n of the integrated semiconductor memory. The second control circuit 30 drives the first controllable switch T1 of the first control circuit 10 with an activation signal AS via a terminal AS for activating the first control circuit 10. The second controllable switches T2a, T2b and T2c are driven by the second control circuit 30 with a respective first switching signal PS1a, PS1b, PS1c via a first switching terminal P10a, P10b and P10c. Furthermore, the second control circuit 30 is connected via second switching terminals P20a, P20b and P20c for driving the switchable resistance network 20 with second switching signals PS2a, PS2b and PS2c.

FIGS. 2A and 2B show the two families of characteristic curves of a transistor, for example, of the transistor T of the integrated semiconductor memory 100 from FIG. 1. FIG. 2A shows the $I_{DS}/U_G$ family of characteristic curves (family of control characteristic curves) and FIG. 2B shows the $I_{DS}/U_{DS}$ family of characteristic curves (family of output characteristic curves) of the transistor T of the integrated circuit. The transistor T is a normally off MOSFET transistor of the n-channel type in the exemplary embodiment of the families of characteristic curves of FIGS. 2A and 2B.

In order to record a family of output characteristic curves, as illustrated in FIG. 2A, the voltage $U_{DS}$ is varied with voltage $U_G$ kept constant and the current $I_{DS}$ is measured. At the beginning of a test operating state of the integrated circuit, only a first quiescent current $I_{CC}$ having a current intensity that depends on the nonreactive resistance RCC of the circuit components 50 flows on the interconnect L.

In a first test cycle of the test operating state, the switching transistors T3a, T3b and T3c are operated such that they are turned off. The switching transistor T1 is turned on by the second control circuit 30. For this purpose, the control terminal ST1 of the switching transistor T1 is driven with the control signal AS by the second control circuit 30. In the illustrated exemplary embodiment of the first control circuit 10, three different 20 gate voltages $U_{G1}$, $U_{G2}$ and $U_{G3}$ can be set at the gate terminal G of the transistor T. In order to generate a first gate control voltage $U_{G1}$, the second control circuit 30 turns on the switching transistor T2a in a first test cycle of the test operating state. For this purpose, the control terminal ST2a of the switching transistor T2a is driven with the control signal PS1a of the second control circuit 30. Consequently, a current I2a flows via the first resistance $R_1$, the switching transistor T1, the switching transistor T2a and the second resistance $R_{2a}$. The first resistance $R_2$ forms, with the second resistance $R_{2a}$ connected downstream in series, a first voltage divider of the first control circuit. Via a control output SE, the first gate control voltage $U_{G1}$ dropped across the second resistance of the first voltage divider can be tapped off and fed to the control terminal G of the transistor T. The first and second resistances of the first control circuit 10 are dimensioned such that the transistor T is turned on.

The quiescent current $I_{CC}$ flowing on the interconnect L is increased by the current component I2a of the first control circuit 10 in the first test cycle. A voltage generator 200 for generating the external supply voltage VDD, which voltage generator is connected to the input terminal VIN, feeds in a current $I1=I_{cc}+I2a$ onto the interconnect L in this case. Assuming that the current fed in on the interconnect L by the voltage generator can be determined, for example, by an ammeter 300 connected to the external voltage generator, the current component I2a of the first control circuit 30 can thus be determined from the known quiescent current $I_{cc}$ and the current I1 flowing on the interconnect L in the first test cycle.

By the external supply voltage VDD generated by the external voltage generator 200 and the current component I2a of the activated first control circuit 10, it is furthermore possible to determine a nonreactive resistance $R_{10}$ of the first control circuit 10, which includes the resistance components of the controlled paths of the switching transistors T1 and T2a and the first and second resistances $R_1$ and $R_{2a}$, between the input terminal E10 and the output terminal A10 of the first control circuit as $R_{10}=VDD/I2a$. The gate control voltage $U_{G1}$ present at the gate terminal G can thus be determined as $U_{G1}=VDD/R_{10}*R_{2a}$ or $U_{G1}=I2a*R_{2a}$.

For variation of the drain-source voltages, in a second test cycle, the second control circuit 30 generates the second switching signal PS2a with which the switching transistor T3a is turned on. Afterward, the second control circuit 30 generates the second switching signal PS2b with which the switching transistor T3b is turned on, and the second switching signal PS2c with which the switching transistor T3c is turned on. Consequently, in the second test cycle, a first drain-source current $I_{DS1}$ flows via the path of the transistor T that was turned on in the first test cycle.

Therefore, a current increase by the current component $I_{DS1}$ results on the interconnect L. Consequently, a current $I2=I_{cc}+I2a+I_{DS1}$ flows on the interconnect L in the second test cycle of the test operating state. Since the current $I_{cc}+I2a$ is known from the first test cycle of the test operating state, the first drain-source current $I_{DS1}$ can be determined by the measurable current increase at the output terminal VOUT of the integrated circuit in the second test cycle.

The voltage $U_{DS1}$ can be determined from the supply voltage VDD present at the input terminal D of the circuit component T, from the current increase on the interconnect L by the current $I_{DS1}$, and from the resistance value of the series resistance $R_{3a}$, which is known from the circuit design, as $U_{DS1}=VDD-I_{DS1}*R_{3a}$. Consequently, the first characteristic curve point $U_{DS1}/I_{DS1}$ of the family of output characteristic curves of FIG. 2A is known.

By sequentially turning on the further switching transistors T3b and T3c in the second test cycle, drain-source voltages $U_{DS2}$ and $U_{DS3}$ and their associated drain-source currents $I_{DS1}$ and $I_{DS2}$ can each be determined for the first gate control voltage $U_{GS1}$ applied to the control terminal G. From the three current/voltage values determined, it is possible to determine the first characteristic curve associated with the control voltage $U_{G1}$ of the family of output characteristic curves by interpolation.

In order to determine further characteristic curves of the family of output characteristic curves, for example, the characteristic curves associated with the gate control voltages $U_{G2}$ and $U_{G3}$ in FIG. 2B, the second control circuit 30 operates the integrated circuit in the first test operating state again. In the first test operating state, the switching transistors T3a, T3b and T3c of the switchable resistance network 20 are again operated such that they are turned off. The switching transistor T2a of the first control circuit 10 is then operated such that it is turned off and the switching transistor T2b is turned on instead. Consequently, the second gate control voltage $U_{G2}$ is set at the gate terminal G of the transistor T. By the measurable current increase on the interconnect L by the current component I2b, it is possible to determine the gate voltage $U_{G2}$ present at the gate terminal. In the second test cycle, the switching transistors T3a, T3b and T3c are turned on successively. Three different drain-source voltages $U_{DS1}$, $U_{DS2}$ and $U_{DS3}$ of the transistor T can be generated as a result. The respective drain-source current $I_{DS1}$, $I_{DS2}$ and $I_{DS3}$ can be determined by the respective current increase at the three different drain-source voltages on the interconnect L. Consequently, it is possible to obtain a further characteristic curve, for example, the characteristic curve associated with $U_{G2}$, in the family of output characteristic curves of FIG. 2B.

In order to determine a third characteristic curve of the family of output characteristic curves, the second control circuit 30 then operates the integrated circuit in the first test cycle again. For this purpose, the switching transistors T3a, T3b and T3c are turned off again. The switching transistor T2b of the first control circuit 10 is likewise switched into the off state. By virtue of the control terminal ST2c being driven with the control signal PS2c, the switching transistor T2c is turned on and thus generates a further gate voltage $U_{G3}$ at the gate terminal G. At this gate voltage, the switching transistors T3a, T3b and T3c are then turned on successively again in the second test cycle of the test operating state. Consequently, between the terminal D and the terminal S of the transistor T, it is again possible to determine three different drain-source voltages $U_{DS1}$, $U_{DS2}$, $U_{DS3}$ and their associated drain-source currents $I_{DS1}$, $I_{DS2}$ and $I_{DS3}$ of the third characteristic curve of the family of output characteristic curves of FIG. 2B.

The family of control characteristic curves of the transistor T can be determined from the family of output characteristic curves by extrapolation. The dashed line between the curves of FIGS. 2A and 2B illustrate the method. For a characteristic curve where $U_{G1}$=const., it is possible to ascertain three $U_G/I_{DS}$ characteristic curve points in the family of control characteristic curves, which each lie on three different characteristic curves where $U_{DS}$=const.

The quiescent current $I_{cc}$ flowing on the interconnect L at the beginning of the test operating state or the current $I_{cc}$+I2a flowing on the interconnect L in the first test cycle of the test operating state is of the order of magnitude of approximately 600 µA to 1.2 mA. Since the additional current taken up by the transistor T in the second test cycle of the test operating state is an order of magnitude of 2.3 µA, the current increase on the interconnect L is detected with difficulty. It is recommended, therefore, to connect not one transistor T, but a multiplicity of identically formed transistors T between the terminals D, G and S. The current increase in the second test cycle is significantly increased and thus detected more easily.

The circuit component T is, for example, a circuit component of significance to the correct functioning of the integrated circuit. In the case of an integrated semiconductor memory, the circuit concept proposed is suitable, in particular, for recording characteristic curves of the selection transistors of DRAM memory cells. FIGS. 3A and 3B show important characteristic design parameters of the transistor. FIG. 3A shows a cross section through a transistor. The active part of the transistor comprises a conductive crystal, the substrate SU, which may be either n- or p-doped. Below a source terminal S and a drain terminal D, two conductively doped island regions G1 and G2, respectively, are introduced by doping within the substrate. The regions are n- or p-doped oppositely to the doping of the substrate. In FIG. 3A, the island regions G1 and G2 are in each case n-doped and the substrate is p-doped. The transistor thus has an npn doping profile. A gate terminal G, which is formed as a metallic contact MK, is connected to the semiconductor surface via an insulator I. A conductive channel K having the channel length LK, which connects the source and drain regions, can form below the insulator. An n-conducting channel forms, for example, in the case of an npn doping profile. If, for the purpose of forming the n-conducting channel, as is illustrated in FIG. 3A, a voltage has to be applied to the gate terminal G, so that a voltage potential $U_{GS}$ occurs between the gate terminal and the source terminal, the transistor is a transistor of the conductivity type of an n-channel enhancement type NA. By contrast, if a conductive channel has been produced by weak n-type doping during production of the transistor, so that a conductive bridge is formed between the source and drain regions without applying a gate voltage, the transistor is a transistor of the conductivity type of a normally on transistor or of a depletion type.

FIG. 3B shows, in a simplified plan view of the transistor structure, the regions G1 and G2 connected to the source terminal S and the drain terminal D. The regions are connected to one another via a channel K with a channel width WK. The current flowing between drain and source terminals depending on a voltage $U_{DS}$ is dependent on the ratio of the channel length LK to the channel width WK.

If the transistor T illustrated in FIG. 1 is produced together with the selection transistors of the memory cell array in one production step, then the transistor T can be produced, without additional outlay, with the same specific conductivity type, the same specific doping profile, and the same specific channel width to channel length ratio. The behavior of the selection transistors of interest can be deduced from the recorded characteristic curves of the transistor T.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 First control circuit
20 Switchable resistance network
30 Second control circuit
40 Memory cell array
50 Circuit component
100 Integrated semiconductor memory
200 External voltage generator
300 External ammeter
VDD Supply potential
VIN Input terminal of the integrated circuit
VOUT Output terminal of the integrated circuit
$I_{cc}$ Quiescent current
I1, I2 First current, second current
I2a, . . . ,c Currents of the first control circuit
L Interconnect
E Input terminal
A Output terminal
R Resistance
T Transistor
SE Control output
ST Control terminal
D Drain input terminal
S Source output terminal
G Gate control terminal
AS Activation signal
PS Switching signal P Switching terminal
S30 Control terminal of the integrated circuit
CLK Control clock
S1, . . . Sn Control signals of the control circuit
$U_G$ Gate voltage
$U_{DS}$ Drain-source voltage
$I_{DS}$ Drain-source current
WL Word line
BL Bit line
SC Storage capacitor
AT Selection transistor
SZ Memory cell
GND Reference potential

What is claimed is:

1. An integrated circuit, comprising:
an output terminal;
a circuit component with an input terminal, a control terminal and an output terminal;
a first control circuit for generating a control signal; and
a switchable resistance network with an input side and an output side, and including a first and a second resistance, wherein either the first resistance or the second resistance is connected between the input side and the output side;
wherein an input voltage is fed to the input terminal of the circuit component, the output terminal of the circuit component is connected to the output terminal of the integrated circuit via the switchable resistance network, the control signal generated by the first control circuit is fed to the control terminal of the circuit component, and the circuit component is designed such that a current is generated at the output terminal of the circuit component in a manner dependent on the control signal and the resistance connected between the input side and the output side of the switchable resistance network.

2. The integrated circuit as claimed in claim 1, wherein the first control circuit includes switching terminals for driving with first switching signals, and the first control circuit is designed such that different control signals are generated in a manner dependent on the driving with the first switching signals.

3. The integrated circuit as claimed in claim 1, wherein the first control circuit includes an input terminal for applying a first voltage potential, an output terminal for applying a second voltage potential, a first voltage divider, a second voltage divider, and a first control circuit designed such that, in a manner dependent on the driving of the switching terminals with the first switching signals, either the first voltage divider or the second voltage divider is connected between the input terminal and the output terminal of the first control circuit.

4. The integrated circuit as claimed in claim 3, wherein the first and second voltage dividers of the first control circuit each include a common first resistance and a respective different second resistance, the common first resistance of the first control circuit is connected between the input terminal and a control output of the first control circuit, the respective different second resistances of the first and second voltage dividers of the first control circuit are connected between the control output and the output terminal of the first control circuit, and the control terminal of the circuit component is connected to the control output of the first control circuit.

5. The integrated circuit as claimed in claim 4, wherein the first control circuit includes a first controllable switch with a control terminal and second controllable switches with respective control terminals, the first controllable switch of the first control circuit is connected between the first common resistance and the control terminal of the first control circuit, a respective one of the second controllable switches of the first control circuit is connected between one of the second resistances and the control terminal (SE) of the first control circuit, an activation signal is fed to the control terminal of the first controllable switch, and a respective one of the first switching signals is fed to a respective one of the control terminals of the controllable switches of the first control circuit.

6. The integrated circuit as claimed in claim 3, wherein the input terminal of the first control circuit is a terminal for applying a supply potential, and the first control circuit is connected, on the input side, to an input terminal of the integrated circuit for applying the supply potential.

7. The integrated circuit as claimed in claim 3, wherein the output terminal of the first control circuit is a terminal for applying a reference potential, and the first control circuit is connected, on the output side, to an output terminal of the integrated circuit for applying the reference potential.

8. The integrated circuit as claimed in claim 5, wherein the first controllable switch of the first control circuit is a switching transistor, and the second controllable switches of the first control circuit are each a switching transistor.

9. The integrated circuit as claimed in claim 1, wherein the switchable resistance network includes switching terminals for driving with second switching signals, the switchable resistance network designed such that, in a manner dependent on the driving of the switchable resistance network by the second switching signals, either the first resistance or the second resistance of the switchable resistance network is connected between the input side and the output side of the switchable resistance network.

10. The integrated circuit as claimed in claim 9, wherein the switchable resistance network includes controllable switches with a respective control terminal, a respective one of the controllable switches of the switchable resistance network is connected between the input terminal of the switchable resistance network and a respective one of the first and second resistances of the switchable resistance network, and a respective one of the switching signal is fed to a respective one of the control terminals of the controllable switches of the switchable resistance network.

11. The integrated circuit as claimed in claim 10, wherein the controllable switches of the switchable resistance network are each a switching transistor.

12. The integrated circuit as claimed in claim 2, further comprising:
control terminals for applying control signals; and
a second control circuit for generating the activation signal, the first switching signals, and the second switching signals, wherein the second control circuit is connected to the control terminals of the integrated circuit on the input side, and the second control circuit generates in a manner dependent on the control signals, on the output side one of the first switching signals and the second switching signals.

13. The integrated circuit as claimed in claim 1, wherein the input terminal of the circuit component is connected to the input terminal of the integrated circuit for applying the supply potential.

14. The integrated circuit as claimed in claim 1, wherein the circuit component is a field effect transistor and a drain source current is generated at a source terminal of the field effect transistor in a manner dependent on a gate voltage.

15. The integrated circuit as claimed in claim 1, further comprising:

a memory cell array with memory cells, wherein the memory cells each include a selection transistor for selecting one of the respective memory cells, the selection transistor is a transistor with a predetermined conductivity type, a predetermined doping profile, and a predetermined channel width to channel length ratio, and the circuit component is a transistor with the predetermined conductivity type, the predetermined doping profile, and the predetermined channel width to channel length ratio.

* * * * *